US012571692B2

(12) United States Patent
Gregory et al.

(10) Patent No.: US 12,571,692 B2
(45) Date of Patent: Mar. 10, 2026

(54) LITHOGRAPHIC STRAIN GAUGE IN AN ELECTRICALLY CONDUCTING SUBSTRATE

(71) Applicant: Microsoft Technology Licensing, LLC, Redmond, WA (US)

(72) Inventors: Luke Thomas Gregory, Mercer Island, WA (US); Rick Chun Kit Cheung, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 316 days.

(21) Appl. No.: 17/849,453

(22) Filed: Jun. 24, 2022

(65) Prior Publication Data

US 2023/0417609 A1     Dec. 28, 2023

(51) Int. Cl.
| | |
|---|---|
| *G01L 1/22* | (2006.01) |
| *H05K 1/185* | (2026.01) |
| *H05K 3/32* | (2006.01) |
| *H05K 3/46* | (2006.01) |

(52) U.S. Cl.
CPC ........... *G01L 1/2293* (2013.01); *G01L 1/225* (2013.01); *H05K 1/188* (2013.01); *H05K 3/32* (2013.01); *H05K 3/467* (2013.01)

(58) Field of Classification Search
CPC .............................. G01L 1/2293; G01L 1/225
USPC ........................................................... 73/708
See application file for complete search history.

(56) References Cited

U.S. PATENT DOCUMENTS

| | | | |
|---|---|---|---|
| 2014/0331741 A1* | 11/2014 | Shah ................... | H04M 1/0277 73/12.06 |
| 2019/0178730 A1* | 6/2019 | Lee ......................... | G01L 1/125 |

OTHER PUBLICATIONS

"International Search Report and Written Opinion Issued in PCT Application No. PCT/US23/021615", Mailed Date: Aug. 8, 2023, 09 Pages.

* cited by examiner

*Primary Examiner* — Peter J Macchiarolo
*Assistant Examiner* — Rodney T Frank
(74) *Attorney, Agent, or Firm* — Ray Quinney & Nebeker P.C.; Paul N. Taylor

(57) ABSTRACT

An electrically conducting substrate includes a plurality of layers. A strain gauge is deposited on a layer of the plurality of layers. The strain gauge measures the stress and/or strain of the electrically conducting substrate. This allows the strain gauge to determine whether a stress or strain of the electrically conducting substrate has caused the electrically conducting substrate to deform, crack, or break.

20 Claims, 12 Drawing Sheets

LITHOGRAPHIC STRAIN GAUGE IN AN ELECTRICALLY CONDUCTING SUBSTRATE

CROSS-REFERENCE TO RELATED APPLICATIONS

N/A.

BACKGROUND

Electronic devices are formed from multiple layers of silicon and electrically conducting material. The silicon and electrically conducting material may be arranged into patterns that may allow the electronic device to perform processing functions, communication functions, sensing functions, and so forth. During fabrication, shipping, handling, installation, operation, and other events, the electronic device may be exposed to forces. In some situations, the forces may deform, crack, or break the electronic device.

BRIEF SUMMARY

In some aspects, the techniques described herein relate to an electronic circuit. The electronic circuit includes an electrically conductive substrate formed from a bottom layer, a top layer, and a strain gauge deposited on a layer between the bottom layer and the top layer.

In some aspects, the techniques described herein relate to a computing device. The computing device includes an electrically conducting substrate, the electrically conducting substrate including a plurality of layers including a bottom layer and a top layer. A strain gauge is located in the plurality of layers between the bottom layer and the top layer, the strain gauge being configured to measure a strain of the electrically conducting substrate.

In some aspects, the techniques described herein relate to a method for manufacturing a substrate, including depositing a first layer of an electrically conducting substrate, depositing a strain gauge on the first layer of the electrically conducting substrate, and depositing a second layer of the electrically conducting substrate on top of the strain gauge.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific implementations thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example implementations, the implementations will be described and explained with additional specificity and detail through the use of the accompanying drawings in which.

DETAILED DESCRIPTION

Figure 1:
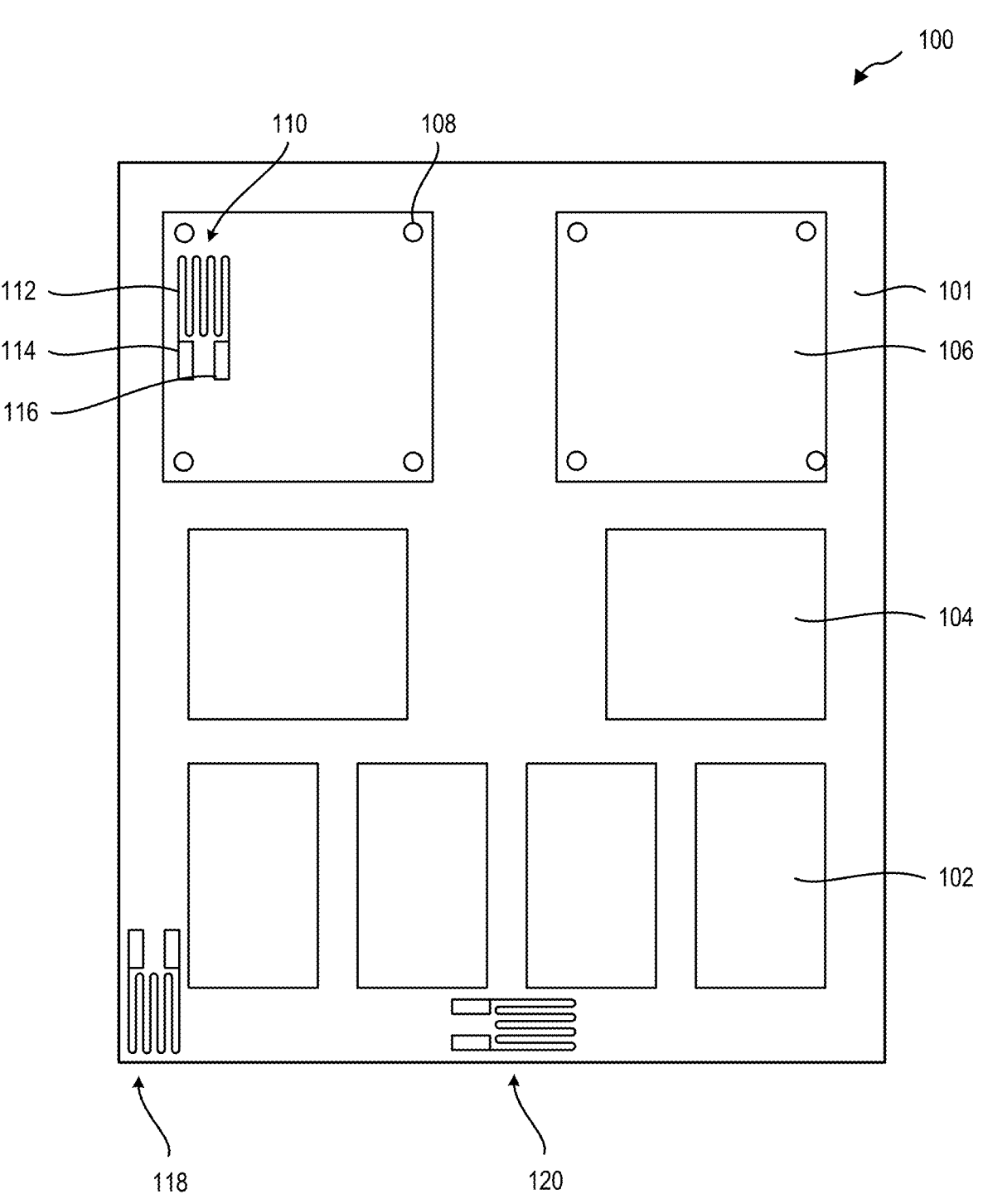
FIG. 1 is a representation of an electronic circuit, according to at least one embodiment of the present disclosure.

This disclosure generally relates to devices, systems, and methods for determining forces applied to a bare die, printed circuit board (PCB), or other electrically conducting substrate. During fabrication and assembly of electronic devices, various forces may be applied to the underlying silicon substrate. For example, a heat sink or other thermal management element (such as a vapor chamber or cold plate) may be connected to a processor installed on an electrically conducting substrate. The connection between the heat sink and the electrically conducting substrate may apply forces to the substrate. Indeed, minor differences in connection elements and connection forces (due to, for example, differences in manufacturing tolerances) may cause uneven loading of the electrically conducting substrate. In some situations, loading of the electrically conducting substrate may cause the electrically conducting substrate to crack or be otherwise damaged. This may result in decreased performance of the electronic device, and may result in repair or replacement of the electronic device. In some situations, an operator or manager of the electronic device may not identify the damage to the electronic substrate until he or she installs and/or attempts to operate the electronic device.

In accordance with at least one embodiment of the present disclosure, a strain gauge may be installed between two layers of the electrically conducting substrate. The strain gauge may be internal to and integrally formed with the electrically conducting substrate. The internal strain gauge may detect and measure deformations of the electrically conducting substrate. The deformations may be quantified into a strain of the electrically conducting substrate. The strain may, in turn, be used along with the modulus of elasticity of the substrate to determine the stress applied to the substrate. If the stress and strain are above a threshold value, then the operator may determine that the electrically conducting substrate, or at least one layer of the substrate, has cracked or broken. This may provide the operator with earlier warning of the damage, thereby allowing the operator to repair or replace the electronic device earlier, which may reduce the impact of a damaged processor or other electronic device.

In some embodiments, the strain gauge may be formed at the time the electronically conducting substrate is formed. For example, processors and other electronic devices are formed of a series of layers. Electrically conducting material may be deposited on the layers in various patterns, with the patterns being associated with one or more functions of the processor or electronic device. In some embodiments, the strain gauge may be formed between two layers of the electrically conducting substrate. In this manner, the strain gauge may be internal to and integrally formed with the electrically conducting substrate. This may allow the strain gauge to measure internal stress and strain of the substrate, thereby providing measurements that may be representative of the internal stresses on the substrate.

The strain gauge may be connected to other layers of the substrate. For example, the positive and negative leads of the strain gauge may be connected to the transistor layer of the substrate. This may allow the strain gauge to be directly controlled by the processor formed by the substrate. In some embodiments, the strain gauge may be connected to a signal layer of the substrate. Connecting the strain gauge to the signal layer may allow the strain gauge measurements to be transmitted to different locations of the processor or electronic device. This may allow the strain gauge to be located at a location of the substrate that is remote from the portion of the processor that manages the strain gauge. For example, the strain gauge may be located at a corner of the substrate, where stress concentrations may be higher, and the strain gauge may be connected to a portion of the processor located away from the corner.

FIG. 1 is a representation of an electronic circuit 100, according to at least one embodiment of the present disclosure. The electronic circuit 100 may be any type of electronic circuit 100. For example, the electronic circuit 100 may be incorporated into a computing device. In some embodiments, the computing device or electronic circuit 100 may include an integrated circuit, an ASIC, a microchip, a processor, a CPU, a GPU, any other circuit, and combinations thereof. In some embodiments, the computing device may any computing device, such as a server, a personal electronic device, a laptop computer, a mobile device, a tablet, a smartphone, any other computing device, and combinations thereof. The electronic circuit 100 may include an electrically conductive substrate 101. The electrically conductive substrate 101 may be the base of the electronic circuit 100, and may be formed from a silicon wafer having processors and other circuit elements formed therein. For example, the electrically conductive substrate 101 may include a bare die. In some examples, the electrically conductive substrate 101 may include a printed circuit board (PCB).

The electronic circuit 100 shown includes multiple electrical structures. For example, the electronic circuit 100 shown includes a plurality of cores 102, memory 104, and a heat sink 106. Other structures may be included on the electronic circuit 100, such as conduits, vias, pins, sockets, busses, hubs, sensors, any other structure, and combinations thereof. In some embodiments, one or more of the electrical structures may be a part of the electrically conductive substrate 101, or fabricated into the electrically conductive substrate 101 at the time the electrically conductive substrate 101 is fabricated. For example, the cores 102 and/or the memory 104 may be integrally formed with the electrically conductive substrate 101 at the time the electrically conductive substrate 101 is fabricated.

In some embodiments, one or more of the electrical structures may be connected to the electrically conductive substrate 101 after the electrically conductive substrate 101 is fabricated. For example, the heat sink 106 may be connected to the electrically conductive substrate 101 after the electrically conductive substrate 101 is fabricated, such as over a processor or portion of the electrically conductive substrate 101 that may generate heat. In some examples, a separate processor may be connected to the electrically conductive substrate 101 after fabrication and electrically connected to other structures of the electrically conductive substrate 101.

During fabrication of the electrically conductive substrate 101 and/or construction of the electronic circuit 100, forces may be applied to the electrically conductive substrate 101. For example, connection elements 108 may secure the heat sink 106 to the electrically conductive substrate 101. The connection elements 108 may include one or more of screws, bolts, pins, springs, any other connection element, and combinations thereof. In some embodiments, the connection elements 108 may secure the heat sink 106 to the electrically conductive substrate 101 with a connection force.

In some embodiments, the connection force of the connection elements 108 may apply a force to the electrically conductive substrate 101. In some situations, the connection force of the connection elements 108 may cause the electrically conductive substrate 101 to deform or crack, thereby damaging the electrically conductive substrate 101, reducing and/or breaking the functionality of the electronic circuit 100. In some embodiments, the connection elements 108 may apply different connection forces to the electrically conductive substrate 101, based on manufacturing tolerances and/or installation techniques. Disparate connection forces may cause the electrically conductive substrate 101 to deform and/or crack.

In accordance with at least one embodiment of the present disclosure, one or more strain gauges 110 may be located on the electrically conductive substrate 101 to detect deformation and/or cracking of the electrically conductive substrate 101. The one or more strain gauges 110 may be used to detect stress and/or strain in the electrically conductive substrate 101. A strain gauge may include a wire 112 wound over a surface area. A current is passed through the wire between a first lead 114 and a second lead 116. As the electrically conductive substrate 101 flexes based on applied loading, the wire 112 may flex with it. This may cause an elongation or compression of the wire 112, which may change the resistance of the wire 112. The change in resistance may then be associated with the strain of the electrically conductive substrate 101. The stress applied to the electrically conductive substrate 101 to achieve the strain may be determined using Eq. 1:

$$\sigma = E\varepsilon$$

where $\sigma$ is stress, E is the Young's Modulus or modulus of elasticity of the electrically conductive substrate 101, and $\varepsilon$ is strain. After measuring the strain, and with the known Young's Modulus, the stress of the electrically conductive substrate 101 may be determined.

In some embodiments, based on the measured strain, a controller or monitor may determine whether the stress and/or strain experienced by the electrically conductive substrate 101 has exceeded a threshold. If the stress and/or strain has exceeded the threshold, then the controller or monitor may determine that the electrically conductive substrate 101 may be or has been damaged. For example, the stress or strain threshold may be based on stress or strain values known to deform, crack, break, or combinations thereof, the electrically conductive substrate 101. In this manner, using stress or strain thresholds, the controller or monitor may determine that the electrically conductive substrate 101 is likely to have bent or cracked. The controller or monitor may provide an alert or alarm to an operator of the electronic circuit 100 so that operator may repair or replace the electrically electronic circuit 100. This may allow the operator to mitigate the damage to the electrically conductive substrate 101 before installation and/or failure.

In accordance with at least one embodiment of the present disclosure, the strain gauges 110 may be located on the electrically conductive substrate 101 at or near locations of high stress concentrations. This may allow the manager to identify deformation and/or cracks in the electrically conductive substrate 101 at the locations where they are most likely to occur. For example, the strain gauges 110 may be located near one or more of the connection elements 108. In some examples, the strain gauges 110 may be located near a corner 118 of the electrically conductive substrate 101. In some examples, the strain gauges 110 may be located at a lateral edge 120 of the electrically conductive substrate 101. In some embodiments, the strain gauges 110 may be located at any location of the electrically conductive substrate 101.

Figure 2:
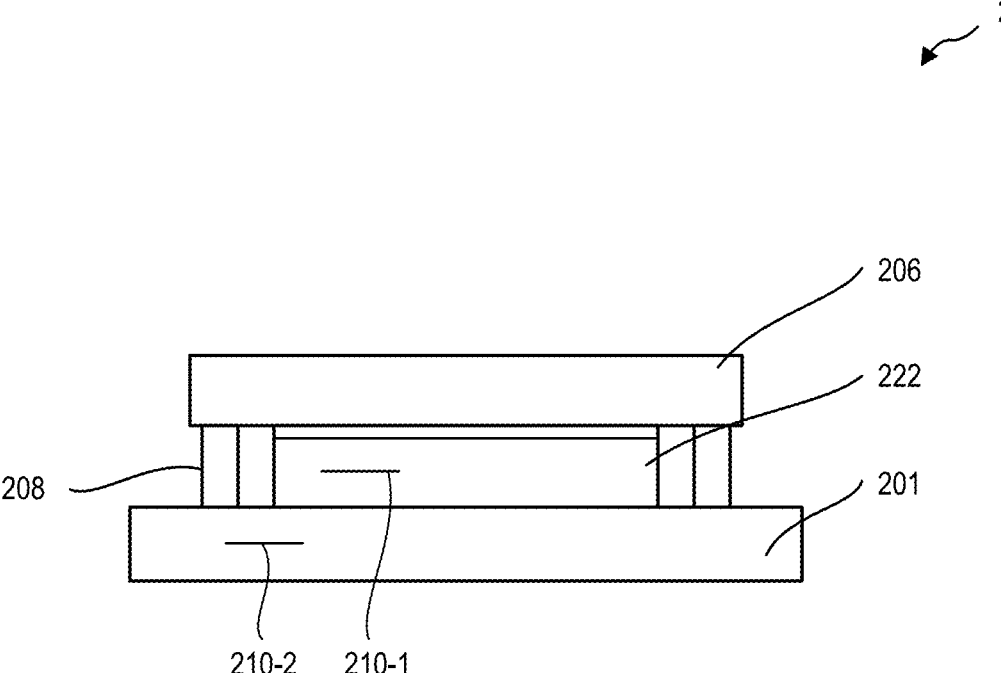
FIG. 2 is a cross-sectional view of an electronic circuit through a heat sink thermally connected to a processor, according to at least one embodiment of the present disclosure.

FIG. 2 is a cross-sectional view of an electronic circuit 200 through a heat sink 206 thermally connected to a processor 222, according to at least one embodiment of the present disclosure. The electronic circuit 200 may be any type of electronic circuit 200. For example, the electronic circuit 200 may be incorporated into a computing device. In some embodiments, the computing device or electronic circuit 100 may include an integrated circuit, an ASIC, a microchip, a processor, a CPU, a GPU, any other circuit, and combinations thereof. In some embodiments, the computing device may any computing device, such as a server, a personal electronic device, a laptop computer, a mobile device, a tablet, a smartphone, any other computing device, and combinations thereof. The heat sink 206 may be connected to an electrically conductive substrate 201 with one or more connection elements 208. The one or more connection elements 208 may apply a pressure to the processor 222 and/or the electrically conductive substrate 201 based on the force applied by the connection elements 208. In some embodiments, the applied force may cause the processor 222 and/or the electrically conductive substrate 201 to deform and/or crack.

In accordance with at least one embodiment of the present disclosure, a strain gauge (collectively 210) may be located at or in the processor 222 and/or the electrically conductive substrate 201. The strain gauge 210 may measure stress and/or strain experienced by the processor 222 and/or the electrically conductive substrate 201. For example, a first strain gauge 210-1 may be connected to or located inside of the processor 222. This may allow the first strain gauge 210-1 to measure the internal stress and/or strain of the processor 222, thereby allowing an operator to detect whether the processor 222 is deforming, cracking, or breaking. In some examples, a second strain gauge 210-2 may be connected to or located inside the electrically conductive substrate 201. This may allow the second strain gauge 210-2 to measure the internal stress and/or strain of the electrically conductive substrate 201, thereby allowing the operator to detect whether the electrically conductive substrate 201 is deforming, cracking, or breaking.

In some embodiments, each structure of the electronic circuit 200 may include its own strain gauge 210. For example, as may be seen, the processor 222 includes the first strain gauge 210-1 and the electrically conductive substrate 201 includes the second strain gauge 210-2. In this manner, the structures or components of the electronic circuit 200 may independently detect potential damage based on the measurements of the strain gauge 210. In some embodiments, a strain gauge 210 may be placed at areas of high stress concentrations, but not at every structure of the electronic circuit 200. Because the areas of high stress concentrations are most likely to deform, crack, and/or break, the strain gauge 210 may allow for detection of damage to the electronic circuit 200 at the most likely locations to be damaged.

Figure 3:
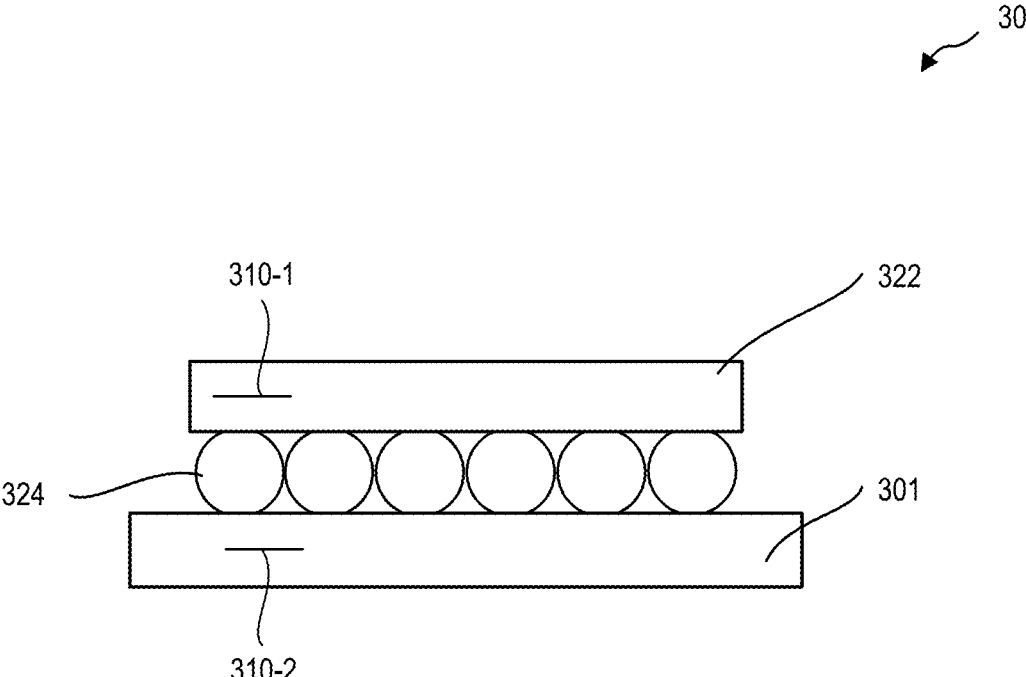
FIG. 3 is a cross-sectional view of an electronic circuit having a processor connected to an electrically conducting substrate with a plurality of solder balls, according to at least one embodiment of the present disclosure.

FIG. 3 is a cross-sectional view of an electronic circuit 300 having a processor 322 connected to an electrically conducting substrate 301 with a plurality of solder balls 324, according to at least one embodiment of the present disclosure. The electronic circuit 300 may be any type of electronic circuit 300. For example, the electronic circuit 300 may be incorporated into a computing device. In some embodiments, the computing device or electronic circuit 100 may include an integrated circuit, an ASIC, a microchip, a processor, a CPU, a GPU, any other circuit, and combinations thereof. In some embodiments, the computing device may any computing device, such as a server, a personal electronic device, a laptop computer, a mobile device, a tablet, a smartphone, any other computing device, and combinations thereof. In some situations, differences in sizes of the solder balls 324 may apply differential forces to the electrically conducting substrate 301 and/or the processor 322. This may cause the electrically conducting substrate 301 and/or the processor 322 to deform, crack, or break.

In accordance with at least one embodiment of the present disclosure, a strain gauge (collectively 310) may be located at or in the processor 322 and/or the electrically conductive substrate 301. The strain gauge 310 may measure stress and/or strain experienced by the processor 322 and/or the electrically conductive substrate 301. For example, a first strain gauge 310-1 may be connected to or located inside of the processor 322. This may allow the first strain gauge 310-1 to measure the internal stress and/or strain of the processor 322, thereby allowing an operator to detect whether the processor 322 is deforming, cracking, or breaking. In some examples, a second strain gauge 310-2 may be connected to or located inside the electrically conductive substrate 301. This may allow the second strain gauge 310-2 to measure the internal stress and/or strain of the electrically conductive substrate 301, thereby allowing the operator to detect whether the electrically conductive substrate 301 is deforming, cracking, or breaking.

Figure 4:
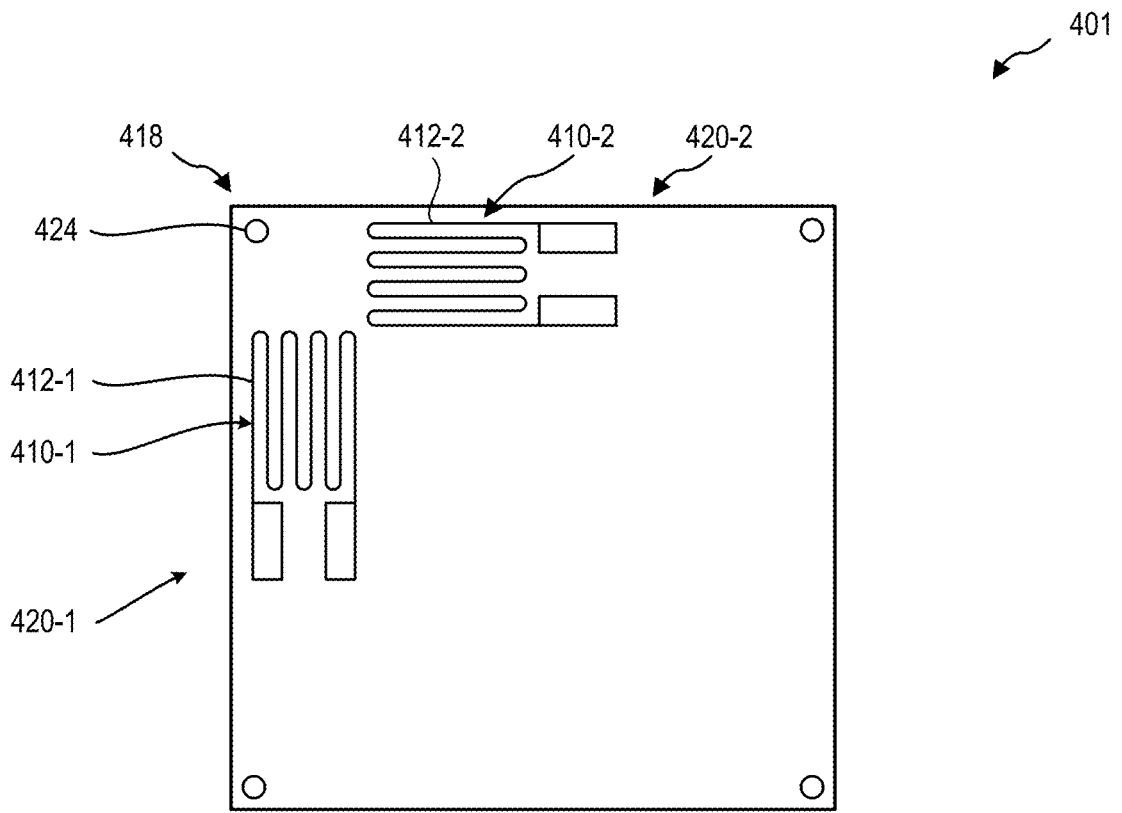
FIG. 4 is a representation of an electrically conductive substrate having a strain gauge installed therein, according to at least one embodiment of the present disclosure.

FIG. 4 is a representation of an electrically conductive substrate 401 having a strain gauge (collectively 410) installed therein, according to at least one embodiment of the present disclosure. While the strain gauges 410 are visible on an exterior of the electrically conductive substrate 401, it should be understood that strain gauges 410 may be located between two layers of the electrically conductive substrate 401, as discussed in further detail herein.

As discussed herein, the strain gauges 410 may be located at any location of the electrically conductive substrate 401. For example, the strain gauges 410 may be located at or proximate to locations of high stress concentrations of the electrically conductive substrate 401, such as the corner 418, the lateral edge (collectively 420), and/or near connection points 424 of the electrically conductive substrate 401. This may allow the strain gauges 410 to detect stress and/or strain at these locations, thereby allowing an operator to determine that whether the electrically conductive substrate 401 has or may have been damaged.

The strain gauges 410 may be oriented in any orientation in the electrically conductive substrate 401. For example, a first strain gauge 410-1 shown in FIG. 4 is shown having a first wire 412-1 that is oriented parallel to a first lateral edge 420-1. A second strain gauge 410-2 has a second wire 412-2 that is oriented parallel to a second lateral edge 420-2. This may allow the strain gauges 410 to determine stress and/or strain of the electrically conductive substrate 401 in directions parallel to the lateral edges 420. This may allow the first strain gauge 410-1 and the second strain gauge 410-2 to determine stress and/or strain in two directions. In some embodiments, the first strain gauge 410-1 and the second strain gauge 410-2 may determine the components of stress and/or strain in the directions with respect to the lateral edges 420.

In some embodiments, the strain gauges 410 may be located proximate to or adjacent to the connection points 424. The strain gauges 410 may be oriented to determine the magnitude and direction of the stress and/or strain on the electrically conductive substrate 401. For example, two strain gauges 410 oriented perpendicular to each other and parallel to the lateral edges 420 may allow the operator to determine the components of strain with respect to the lateral edges 420. In this manner, the operator may determine the direction of the stress and/or strain. This may allow the operator to determine the location of the source of the stress and/or strain, and may allow the operator to determine the cause of the stress and/or strain. Identifying the cause of the stress and/or strain may allow the operator to mitigate future stress and/or strain events by preventing the cause in other electrically conductive substrates 401.

In some embodiments, the first strain gauge 410-1 and the second strain gauge 410-2 may be part of the same strain gauge 410. For example, the strain gauge 410 may be a half-bridge, or a half Wheatstone bridge, strain gauge. In some embodiments, the first strain gauge 410-1 and the second strain gauge 410-2 may be two quarter-bridge strain gauges. While two strain gauges 410 have been shown in FIG. 4, it should be understood that any number of strain gauges 410 may be connected to or formed in the electrically conductive substrate 401, including 1, 2, 3, 4, 5, 6, 7, 8, 9, 10, any other number of times, and combinations thereof.

In some embodiments, a strain gauge 410 may have a wire 412 with rows that are all oriented in the same direction. For example, the first strain gauge 410-1 has a first wire 412-1 that is oriented in rows parallel to the first lateral edge 420-1. The second strain gauge 410-2 has a second wire 412-2 that is oriented in rows parallel to the second lateral edge 420-2. However, it should be understood that a strain gauge 410 may have a wire 412 that is formed with rows that are non-parallel.

Figure 5:
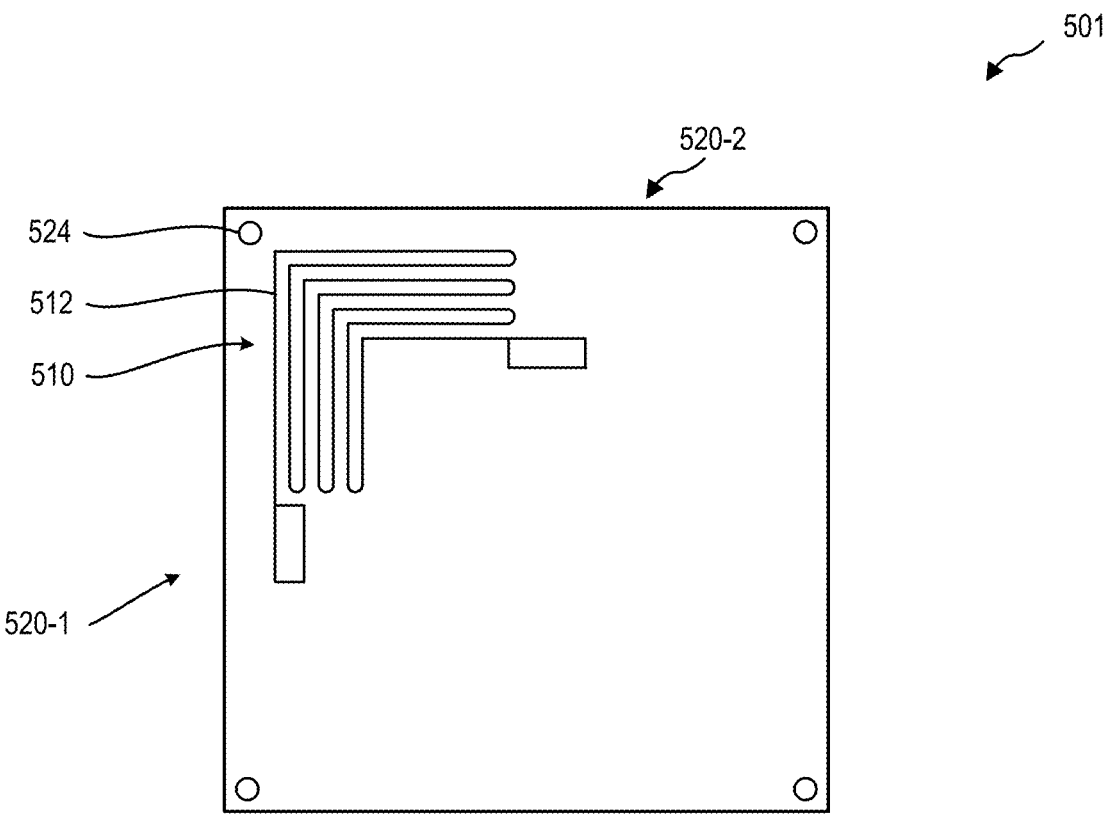
FIG. 5 is a representation of an electrically conductive substrate having a strain gauge installed therein, according to at least one embodiment of the present disclosure.

FIG. 5 is a representation of an electrically conductive substrate 501 having a strain gauge 510 installed therein, according to at least one embodiment of the present disclosure. While the strain gauge 510 is visible on an exterior of the electrically conductive substrate 501, it should be understood that strain gauge 510 may be located between two layers of the electrically conductive substrate 501, as discussed in further detail herein.

In FIG. 5, the strain gauge 510 includes a wire 512 that is oriented in parallel rows that extend parallel to a first lateral edge 520-1, bend with a 90° angle proximate to or at a connection point 524, and extend parallel to a second lateral edge 520-2. In some embodiments, the strain gauge 510 may measure the magnitude of the stress and/or strain of the electrically conductive substrate 501 agnostic to the direction or orientation of the stress and/or strain.

By including a bend in the wire 512, the strain gauge 510 may measure the magnitude of the stress and/or strain of the electrically conductive substrate 501. For example, the portion of the wire 512 that is parallel to the first lateral edge 520-1 may measure stress and/or strain with respect to the first lateral edge 520-1 and the portion of the wire 512 that is parallel to the second lateral edge 520-2 may measure stress and/or strain with respect to the second lateral edge 520-2. This may allow for the measurement of stresses and/or strains that are parallel to opposite sections of the wire 512.

In some embodiments, the operator may determine whether the electrically conductive substrate 501 has experienced a stress and/or strain that may damage the electrically conductive substrate 501 using the strain gauge 510. As discussed herein, the strain gauge 510 may determine the presence of a damaging stress and/or strain. But the operator may determine that the electrically conductive substrate 501 has been damaged without knowing the direction of the damaging stress and/or strain. In this manner, the strain gauge 510 may include a wire 512 that bends to be parallel to the first lateral edge 520-1 and the second lateral edge 520-2 to gain the magnitude of the stress and/or strain without the direction. In this manner, the strain gauge 510 may be simplified, and the collection of the strain gauge 510 may be simplified.

Figure 6:
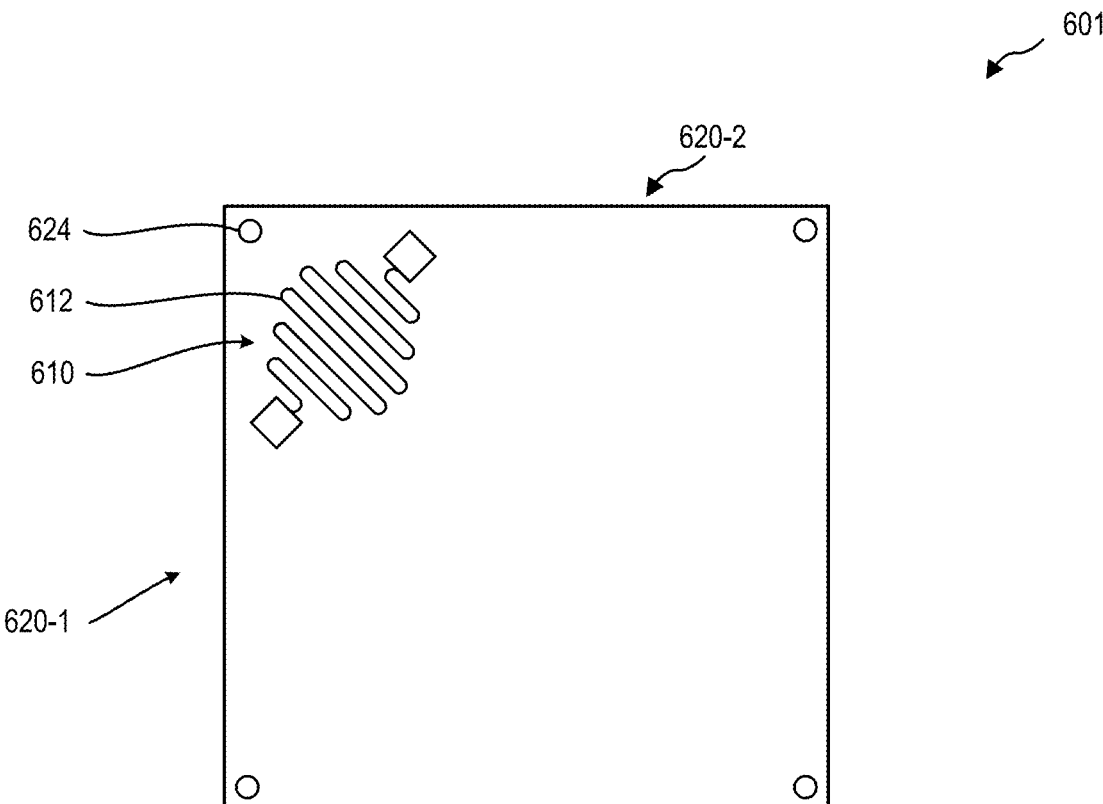
FIG. 6 is a representation of an electrically conductive substrate having a strain gauge installed therein, according to at least one embodiment of the present disclosure.

FIG. 6 is a representation of an electrically conductive substrate 601 having a strain gauge 610 installed therein, according to at least one embodiment of the present disclosure. While the strain gauges 610 are visible on an exterior of the electrically conductive substrate 601, it should be understood that strain gauges 610 may be located between two layers of the electrically conductive substrate 601, as discussed in further detail herein.

The strain gauges 610 may include a wire 612. The wire 612 may be located proximate or adjacent to a connection point 624 and arranged in rows that are oriented at an angle between a first lateral edge 620-1 and a second lateral edge 620-2. For example, the wire 612 may be arranged in rows that bisect the first lateral edge 620-1 and the second lateral edge 620-2. This may allow the strain gauges 610 to detect stress and/or strain that is transverse to the first lateral edge 620-1 and the second lateral edge 620-2.

Figure 7:
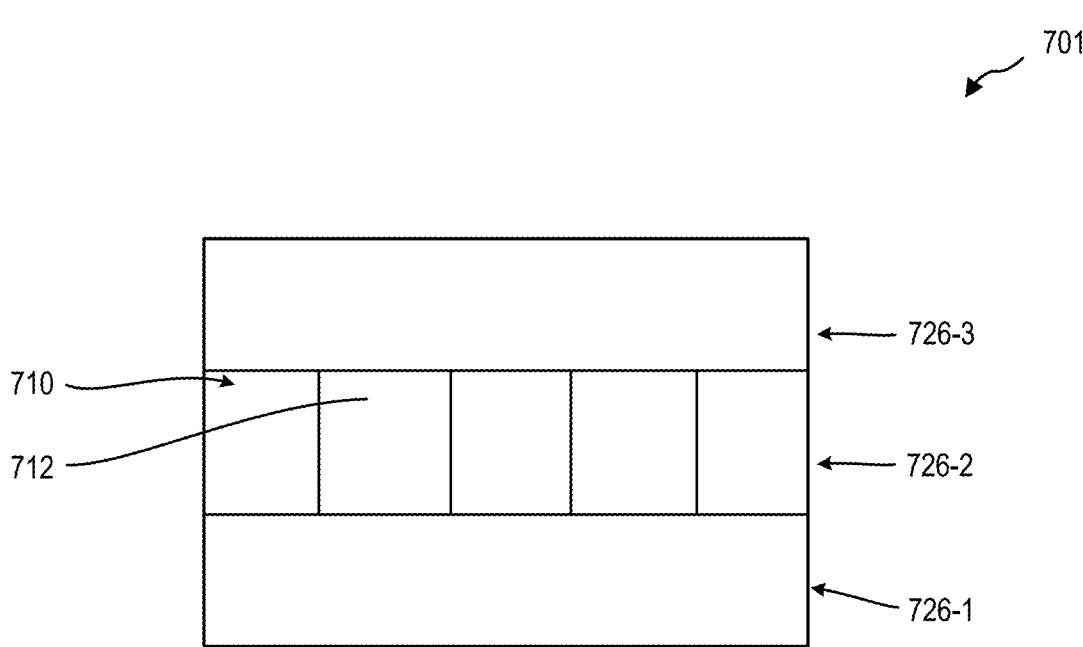
FIG. 7 is a representation of a cross-sectional view of an electrically conductive substrate, including a plurality of layers of the electrically conductive substrate, according to at least one embodiment of the present disclosure.

FIG. 7 is a representation of a cross-sectional view of an electrically conductive substrate 701, including a plurality of layers 726 of the electrically conductive substrate 701, according to at least one embodiment of the present disclosure. For ease of illustration, the electrically conductive substrate 701 shown includes a first layer 726-1, a second layer 726-2, and a third layer 726-3. But it should be understood that the electrically conductive substrate 701 may include any number of layers 726.

The first layer 726-1 may be the bottom layer and the third layer 726-3 may be the top layer of the electrically conductive substrate 701. A strain gauge 710 may be deposited or located in the second layer 726-2. Put another way, the strain gauge 710 may be located between the top layer (e.g., the third layer 726-3) and the bottom layer (e.g., the first layer 726-1) of the electrically conductive substrate 701. This may allow the strain gauge 710 to measure stress and/or strain in an interior of the electrically conductive substrate 701. In some embodiments, the strain gauge 710 may be parallel to the layers 726. For example, the strain gauge 710 (and/or the second layer 726-2) may be parallel to the first layer 726-1 and/or the third layer 726-3.

As may be understood, an electrically conductive substrate 701 may be formed lithographically. Put another way, the electrically conductive substrate 701 may be formed using an additive manufacturing technique, where the layers 726 are formed on top of each other. For example, the first layer 726-1 may be deposited on a base. The second layer 726-2 may be formed on top of the first layer 726-1. To form the strain gauge 710, a wire 712 may be deposited directly on the first layer 726-1. For example, the conductive material that forms the wire 712 may be deposited on the first layer 726-1 using any deposition mechanism, such as vapor deposition and/or laser lithography. In some embodiments, the remainder of the second layer 726-2 may be filled with other structures and/or insulating material. The third layer 726-3 may be deposited on top of the wire 712 of the strain gauge 710. In this manner, the strain gauge 710 may be integrally formed with the electrically conductive substrate 701. Furthermore, the strain gauge 710 may be internal to the electrically conductive substrate 701.

Forming the strain gauge 710 in the interior of the electrically conductive substrate 701 may improve the accuracy of the measurements of the strain gauge 710. Because the strain gauge 710 is located between the top layer and the bottom layer (e.g., between the third layer 726-3 and the first layer 726-1), the strain gauge 710 may measure the stress and/or strain of the second layer 726-2. In this manner, the measurements of the strain gauge 710 may be representative of the stress and/or strain actually experienced by the material of the electrically conductive substrate 701.

Forming the strain gauge 710 integrally with the electrically conductive substrate 701 may improve the connection of the strain gauge 710 to the electrically conductive substrate 701 and/or reduce the interference of the strain gauge 710 with the operation of the electrically conductive substrate 701. For example, a strain gauge 710 connected to the exterior of the electrically conductive substrate 701 with an adhesive may disconnect during handling and/or use. Furthermore, a strain gauge 710 connected to the exterior of the electrically conductive substrate 701 with an adhesive may interfere with other circuits, pins, sockets, or electrical structures on the electrically conductive substrate 701. By integrally forming the strain gauge 710 with the electrically conductive substrate 701, the connection with electrically conductive substrate 701 may be improved and the interference with the operation of the electrically conductive substrate 701 may be reduced. This may improve operation of the electrically conductive substrate 701.

Figure 8:
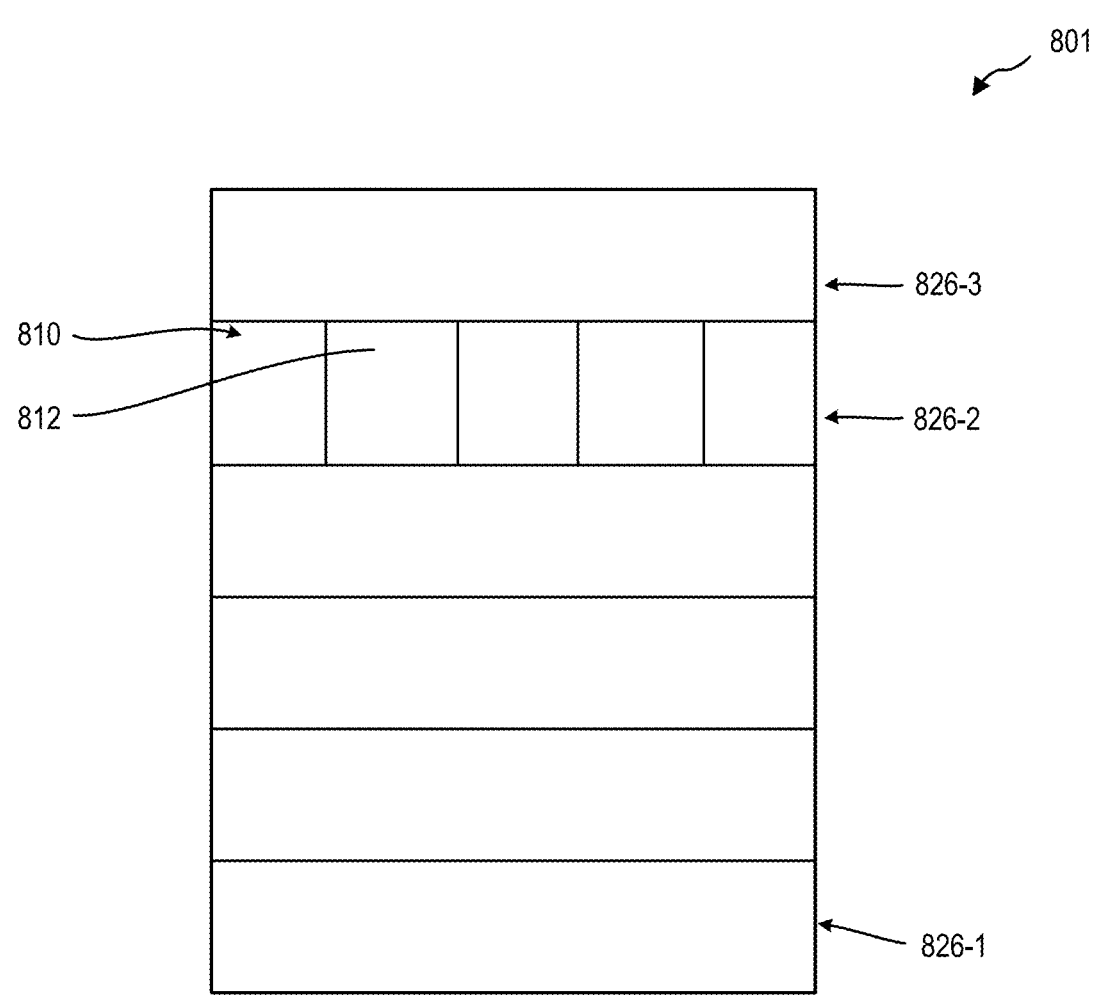
FIG. 8 is a representation of a cross-sectional view of an electrically conductive substrate, including a plurality of layers of the electrically conductive substrate, according to at least one embodiment of the present disclosure.

FIG. 8 is a representation of a cross-sectional view of an electrically conductive substrate 801, including a plurality of layers 826 of the electrically conductive substrate 801, according to at least one embodiment of the present disclosure. For ease of illustration, the electrically conductive substrate 801 shown includes six layers, including a bottom layer 826-1, a strain gauge layer 826-2, and a top layer 826-3. But it should be understood that the electrically conductive substrate 801 may include any number of layers 826.

A strain gauge 810 may be located on the strain gauge layer 826-2. The strain gauge layer 826-2 may be proximate to or adjacent to the top layer 826-3. For example, the strain gauge layer 826-2 may be located immediately underneath the top layer 826-3 of the electrically conductive substrate 801. Put another way, the top layer 826-3 may be deposited directly on the strain gauge layer 826-2. For example, the strain gauge 810 may include a wire 812 that is deposited on an underlying layer. The top layer 826-3 may be deposited directly on top of the strain gauge layer 826-2, including being deposited directly on the wire 812 of the strain gauge 810.

In some embodiments, the strain gauge 810 may be the only structure located at the strain gauge layer 826-2. For example, the strain gauge layer 826-2 may be dedicated to the strain gauge 810, including the strain gauge 810 shown and any other strain gauges installed on the electrically conductive substrate 801. In some embodiments, the strain gauge layer 826-2 may include any other electronic structure, such as sensors, communication busses, transistors, vias, any other structure, and combinations thereof.

In some embodiments, depositing the strain gauge 810 proximate to or adjacent to the top layer 826-3 may include depositing the strain gauge 810 on a strain gauge layer 826-2 that is located closer to the top layer 826-3 than the bottom layer 826-1. For example, the electrically conductive substrate 801 may include one or more layers 826 between the strain gauge layer 826-2 and the top layer 826-3.

Locating the strain gauge 810 proximate or adjacent to the top layer 826-3 may allow for stress and/or strain measurements that are representative of the stress and/or strain experienced by the top layer 826-3. In this manner, the strain gauge 810 may detect stress and/or strain that may damage the top layer 826-3 and/or top layers of the electrically conductive substrate 801.

Figure 9:
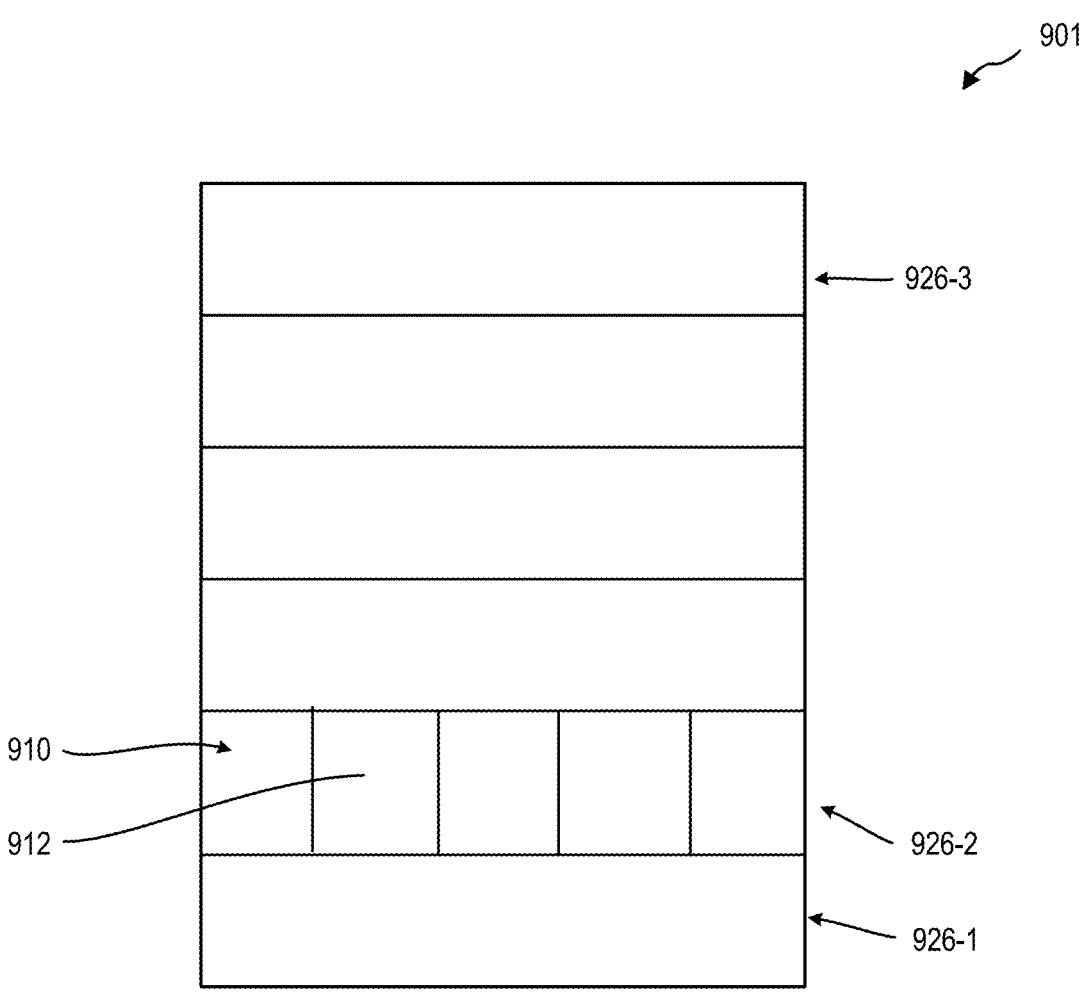
FIG. 9 is a representation of a cross-sectional view of an electrically conductive substrate, including a plurality of layers of the electrically conductive substrate, according to at least one embodiment of the present disclosure.

FIG. 9 is a representation of a cross-sectional view of an electrically conductive substrate 901, including a plurality of layers 926 of the electrically conductive substrate 901, according to at least one embodiment of the present disclosure. For ease of illustration, the electrically conductive substrate 901 shown includes six layers, including a bottom layer 926-1, a strain gauge layer 926-2, and a top layer 926-3. But it should be understood that the electrically conductive substrate 901 may include any number of layers 926.

A strain gauge 910 may be located on the strain gauge layer 926-2. The strain gauge layer 926-2 may be proximate to or adjacent to the bottom layer 926-1. For example, the strain gauge layer 926-2 may be located immediately above the bottom layer 926-1 of the electrically conductive substrate 901. Put another way, the strain gauge layer 926-2 may be deposited directly on the bottom layer 926-1. For example, the strain gauge 910 may include a wire 912 that is deposited on the bottom layer 926-1.

In some embodiments, depositing the strain gauge 910 proximate to or adjacent to the bottom layer 926-1 may include depositing the strain gauge 910 on a strain gauge layer 926-2 that is located closer to the bottom layer 926-1 than the top layer 926-3. For example, the electrically conductive substrate 901 may include one or more layers 926 between the strain gauge layer 926-2 and the bottom layer 926-1.

Locating the strain gauge 910 proximate or adjacent to the bottom layer 926-1 may allow for stress and/or strain measurements that are representative of the stress and/or strain experienced by the bottom layer 926-1. In this manner, the strain gauge 910 may detect stress and/or strain that may damage the bottom layer 926-1 and/or bottom layers of the electrically conductive substrate 901.

While embodiments of the present disclosure discuss the strain gauge 910 on the strain gauge layer 926-2, it should be understood that the electrically conductive substrate 901 may include strain gauges 910 on any layer 926 of the electrically conductive substrate 901. In some embodiments, the electrically conductive substrate 901 may include strain gauges 910 on multiple layers 926. For example, the electrically conductive substrate 901 may include a strain gauge 910 proximate to the top layer 926-3 and proximate to the bottom layer 926-1. In some examples, the electrically conductive substrate 901 may include a strain gauge 910 on any layer between the bottom layer 926-1 and the top layer 926-3. Put another way, the electrically conductive substrate 901 may include multiple strain gauge layers 926-2 between the bottom layer 926-1 and the top layer 926-3. In some embodiments, the electrically conductive substrate 901 may include a strain gauge 910 on the bottom layer 926-1 and/or the top layer 926-3.

Figure 10:
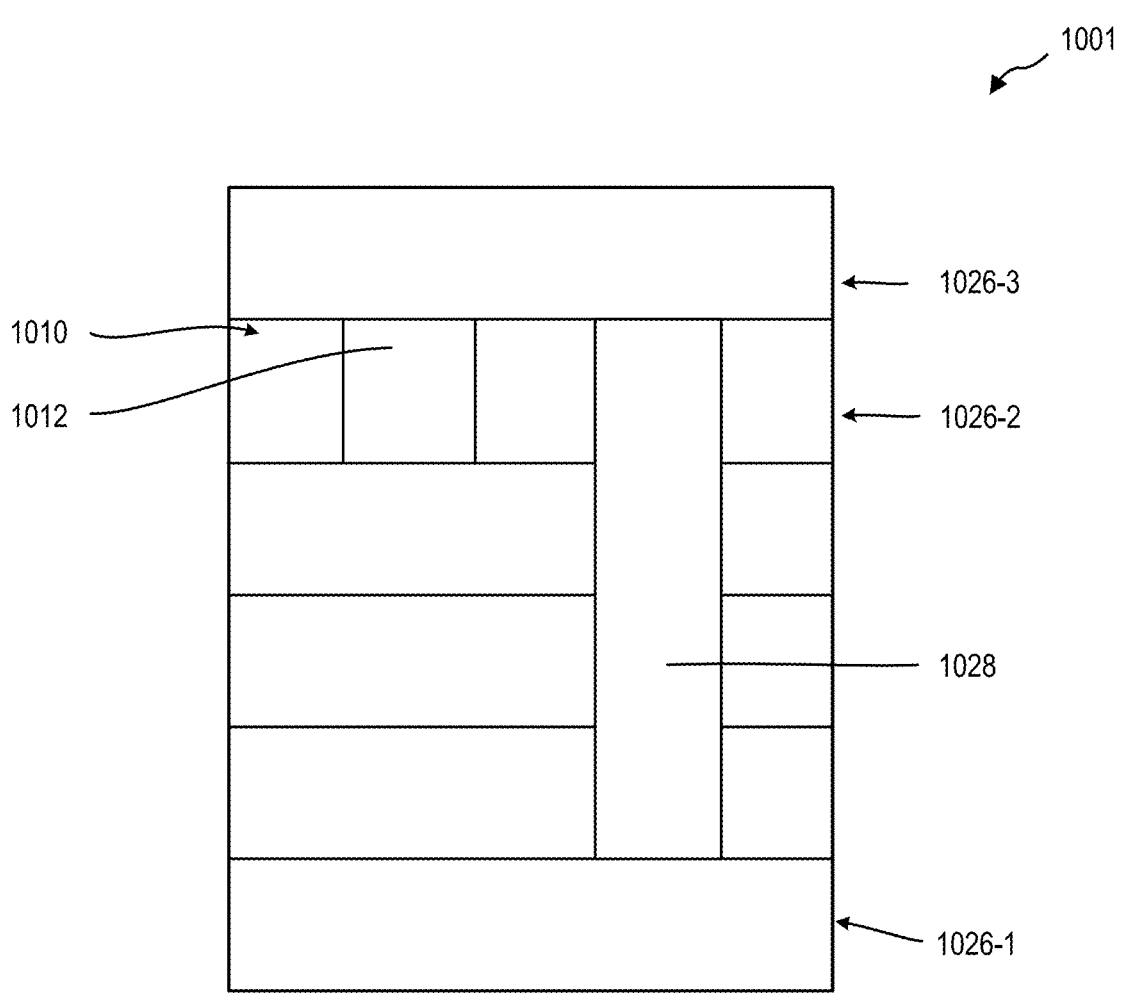
FIG. 10 is a representation of a cross-sectional view of an electrically conductive substrate, including a plurality of layers of the electrically conductive substrate, according to at least one embodiment of the present disclosure.

FIG. 10 is a representation of a cross-sectional view of an electrically conductive substrate 1001, including a plurality of layers 1026 of the electrically conductive substrate 1001, according to at least one embodiment of the present disclosure. For ease of illustration, the electrically conductive substrate 1001 shown includes six layers, including a bottom layer 1026-1, a strain gauge layer 1026-2, and a top layer 1026-3. But it should be understood that the electrically conductive substrate 1001 may include any number of layers 1026.

A strain gauge 1010 may be located on the strain gauge layer 1026-2. In some embodiments, the strain gauge 1010 may be connected to other layers 1026 of the electrically conductive substrate 1001 using a via 1028. The via 1028 may be a series of depositions of conductive material on multiple layers 1026. The depositions of conductive material may be located at the same location on successive layers 1026. This may allow for power and/or electrical signals to be passed between layers 1026.

In some embodiments, the strain gauge 1010 may be directly connected to a transistor layer of the electrically conductive substrate 1001 using the via 1028. For example, the bottom layer 1026-1 may be a transistor layer. The transistor layer may include one or more transistors, switches, or other logic functions. In some embodiments, the strain gauge 1010 may receive power from and be controlled by the transistor layer. For example, the transistor layer may include programmed logic that applies a current to a wire 1012 of the strain gauge 1010 and measures the resistance through the strain gauge 1010. The programmed logic may determine any change in resistance. Using the determined changes in resistance, the programmed logic may determine the stress and/or strain applied to the electrically conductive substrate 1001.

In some embodiments, the strain gauge 1010 may be connected to a signal layer through the via 1028. For example, the bottom layer 1026-1 may include a signal layer. The signal layer may include electrical paths that transit signals between different portions of the electrically conductive substrate 1001. For example, the signal layer may include electrical paths that transmit signals between two cores, between memory units and compute units, or between any other elements of the electrically conductive substrate 1001. The strain gauge 1010 may be connected to the signal layer to provide stress and/or strain measurements from a location that is remote from the portion of the electrically conductive substrate 1001 that is controlling the operation of the strain gauge 1010.

Connecting the strain gauge 1010 to the transistor layer and/or the signal layer using a via 1028 may allow the strain gauge 1010 to be powered and controlled by the processing components of the electrically conductive substrate 1001. This may allow the strain gauge 1010 to monitor the stress and/or strain of the electrically conductive substrate 1001 as long as the electrically conductive substrate 1001 has sufficient power to power the strain gauge 1010. For example, on-board batteries, capacitors, and other power storage elements may be stored on the electrically conductive substrate 1001. These power storage elements may support the electrically conductive substrate 1001 providing power to the strain gauge 1010 when the electrically conductive substrate 1001 is not directly connected to a power outlet. In this manner, the strain gauge 1010 may monitor the stress and/or strain of the electrically conductive substrate 1001 during transit, installation, or at any other unpowered time or activity.

Figure 11:
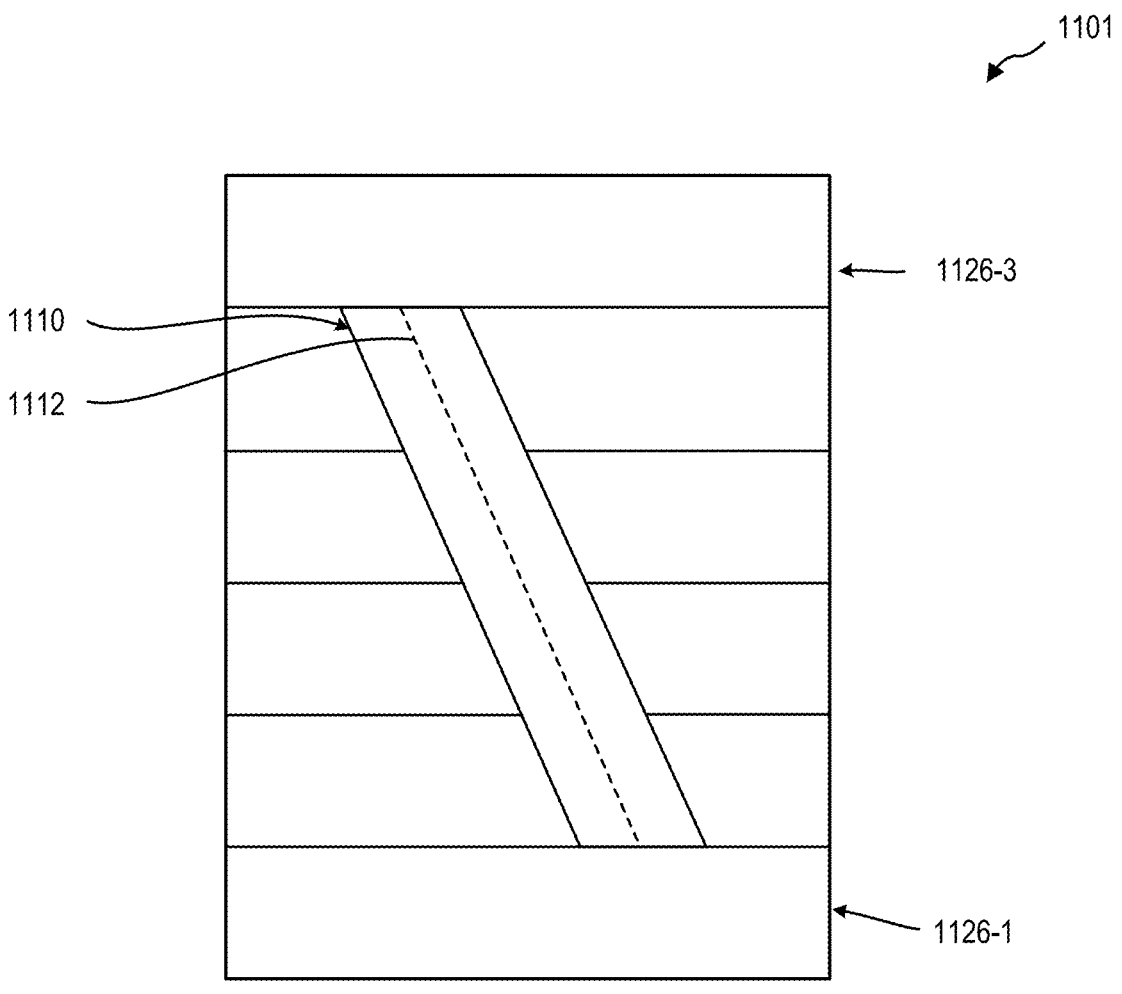
FIG. 11 is a representation of a cross-sectional view of an electrically conductive substrate, including a plurality of layers of the electrically conductive substrate, according to at least one embodiment of the present disclosure.

FIG. 11 is a representation of a cross-sectional view of an electrically conductive substrate 1101, including a plurality of layers 1126 of the electrically conductive substrate 1101, according to at least one embodiment of the present disclosure. For ease of illustration, the electrically conductive substrate 1101 shown includes six layers, including a bottom layer 1126-1 and a top layer 1126-3. But it should be understood that the electrically conductive substrate 1101 may include any number of layers 1126.

The electrically conductive substrate 1101 includes a strain gauge 1110. In the embodiment shown, the strain gauge 1110 may extend across multiple layers 1126. For example, the strain gauge 1110 may include a wire 1112. The wire 1112 may be deposited across multiple layers 1126 of the electrically conductive substrate 1101. For example, during fabrication of the electrically conductive substrate 1101, conductive material may be deposited on successive layers with less than a total overlap. In this manner, the wire 1112 of the strain gauge 1110 may extend across multiple layers 1126.

Extending the strain gauge 1110 across multiple layers 1126 may for measurement of internal stress and/or strain of the electrically conductive substrate 1101. For example, the electrically conductive substrate 1101 may experience internal stress and/or strain, such as stress and/or strain based on differential forces between multiple layers 1126. In some embodiments, such differential forces may shear forces between the bottom layer 1126-1 and the top layer 1126-3. In some embodiments, differential forces may be a result of temperature fluctuations and different coefficients of thermal expansion. In some embodiments, internal stresses or strains (such as those experienced in shear of the electrically conductive substrate 1101) may not be measured using a strain gauge that is parallel to the layers 1126, such as a strain gauge parallel to the bottom layer 1126-1 and/or a strain gauge parallel to the top layer 1126-3. A strain gauge 1110 that is transverse (e.g., non-parallel) to the multiple layers 1126, including being transverse to the bottom layer 1126-1 and transverse to the top layer 1126-3, may measure shear forces on the electrically conductive substrate 1101.

Figure 12:
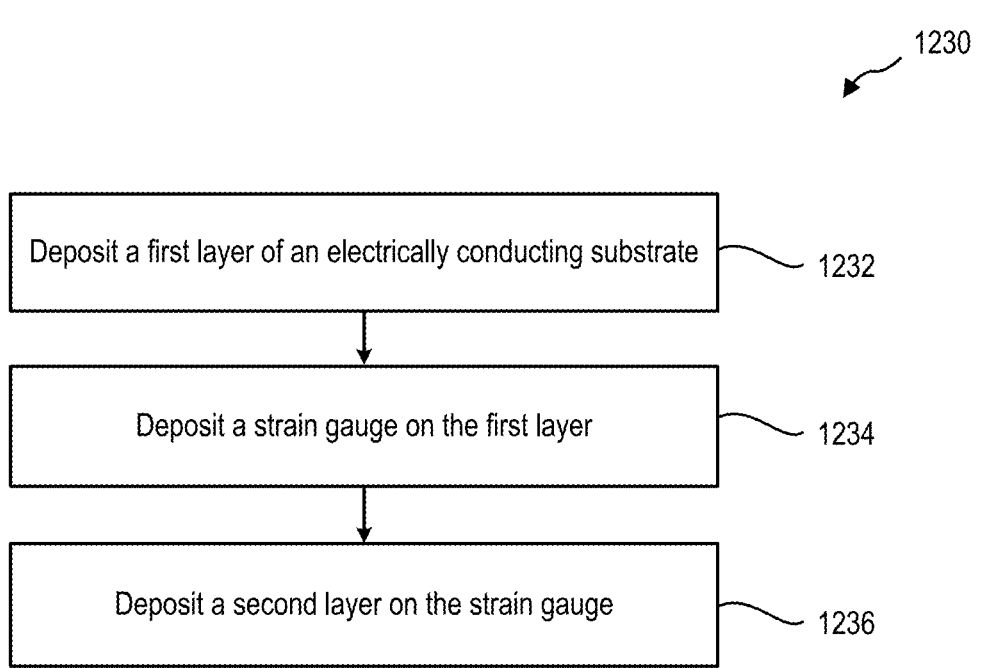
FIG. 12 is a flowchart of a method for manufacturing an electrically conducting substrate, according to at least one embodiment of the present disclosure.

FIG. 12, the corresponding text, and the examples provide a number of different methods, systems, devices, and non-transitory computer-readable media of the monitoring system described herein. In addition to the foregoing, one or more embodiments can also be described in terms of flow-charts comprising acts for accomplishing a particular result, as shown in FIG. 12. FIG. 12 may be performed with more or fewer acts. Further, the acts may be performed in differing orders. Additionally, the acts described herein may be repeated or performed in parallel with one another or parallel with different instances of the same or similar acts.

As mentioned, FIG. 12 illustrates a flowchart of a series of acts for manufacturing a substrate in accordance with one or more embodiments. While FIG. 12 illustrates acts according to one embodiment, alternative embodiments may omit, add to, reorder, and/or modify any of the acts shown in FIG. 12. The acts of FIG. 12 can be performed as part of a method. Alternatively, a non-transitory computer-readable medium can comprise instructions that, when executed by one or more processors, cause a computing device to perform the acts of FIG. 12. In some embodiments, a system can perform the acts of FIG. 12.

The method 1230 includes depositing a first layer of an electrically conducting substrate at 1232. In some embodiments, the first layer may be deposited on a transistor layer. In some embodiments, depositing the first layer may include depositing a via or other electrical conduit through the first layer to an underlying layer, such as a signal layer and/or a transistor layer. A strain gauge is deposited on the first layer of the electrically conducting substrate at 1234. For example, the strain gauge may be deposited using any deposition mechanism, such as vapor deposition and/or laser lithography. As discussed herein, the strain gauge may be directly deposited on the first layer. In some embodiments, depositing the strain gauge may include depositing a strain gauge layer on the first layer, the strain gauge layer including wires deposited in the form of a strain gauge. The method 1230 may further include depositing a second layer of the electrically conducting substrate on the strain gauge at 1236.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An electronic circuit, comprising:
an electrically conductive substrate comprising:
    a first electrically conductive layer;
    a second electrically conductive layer; and
    a strain gauge located inside the electrically conductive
      substrate and extending across the first electrically conductive layer and the second electrically conductive layer at a transverse angle to the first electrically conductive layer and to the second electrically conductive layer, wherein the strain gauge is configured to measure strain within an interior of the electrically conductive substrate.

2. The electronic circuit of claim 1, further comprising a transistor layer, the strain gauge being electrically connected to the transistor layer.

3. The electronic circuit of claim 2, further comprising a signal layer, and wherein the strain gauge is connected to the transistor layer through the signal layer.

4. The electronic circuit of claim 3, wherein a portion of the strain gauge is deposited on the first electrically conductive layer and a portion of the strain gauge is positioned on the second electrically conductive layer.

5. The electronic circuit of claim 4, wherein the electrically conductive substrate includes an electrically conductive top layer and an electrically conductive bottom layer, wherein the first electrically conductive layer and the second electrically conductive layer are positioned between the electrically conductive top layer and the electrically conductive bottom layer.

6. The electronic circuit of claim 1, wherein the strain gauge is located at a lateral edge of the electrically conductive substrate.

7. The electronic circuit of claim 1, wherein strain gauge includes a conductive element that is oriented in parallel rows that extend parallel to a first lateral edge of the electrically conductive substrate, bend, and extend parallel a second lateral edge of the electrically conductive substrate.

8. The electronic circuit of claim 7, wherein the parallel rows of the conductive element bend at a 90° angle.

9. The electronic circuit of claim 7, wherein the parallel rows of the conductive element bend at a connection point of a component connected to the electrically conductive substrate.

10. The electronic circuit of claim 9, wherein the component is a heat sink connected to the electrically conductive substrate at the connection point.

11. A computing device, comprising:
an electrically conductive substrate, the electrically conductive substrate including:
an electrically conductive bottom layer;
an electrically conductive top layer;
a first electrically conductive layer positioned between the electrically conductive bottom layer and the electrically conductive top layer;
a second electrically conductive layer positioned between the electrically conductive bottom layer and the electrically conductive top layer; and a strain gauge located inside the electrically conductive substrate between the electrically conductive bottom layer and the electrically conductive top layer and extending across the first electrically conductive layer and the second electrically conductive layer at a transverse angle to the first electrically conductive layer and to the second electrically conductive layer the strain gauge being configured to measure a strain of the electrically conductive substrate.

12. The computing device of claim 11, wherein the electrically conductive substrate includes a printed circuit board.

13. The computing device of claim 11, wherein the electrically conductive substrate is a bare die.

14. The computing device of claim 11, wherein the electrically conductive substrate further includes a transistor layer configured to perform processing, and wherein the strain gauge is electrically connected to the transistor layer.

15. The computing device of claim 11, wherein the strain gauge is located directly below the electrically conductive top layer.

16. A method for manufacturing an electrically conductive substrate, comprising:
depositing a first layer of an electrically conducting substrate;
depositing a first portion of a strain gauge in the first layer of the electrically conducting substrate;
depositing a second layer of the electrically conducting substrate on top of the first layer of the electrically conductive substrate and on top of the first portion of the strain gauge; and
depositing a second portion of the strain gauge in the second layer of the electrically conducting substrate only partially overlapping the first portion of the strain gauge such that the strain gauge extends across the first layer and the second layer at a transverse angle to the first layer and to the second layer.

17. The method of claim 16, further comprising connecting the strain gauge to a transistor layer through the first layer.

18. The method of claim 17, wherein depositing the first layer includes depositing the first layer on a transistor layer of the electrically conducting substrate.

19. The method of claim 16, wherein depositing the strain gauge includes depositing the strain gauge by vapor deposition.

20. The method of claim 16, further comprising detecting a differential shear force across the first layer and the second layer of the electrically conducting substrate using the strain gauge.

* * * * *